United States Patent
Wang et al.

(10) Patent No.: US 10,522,538 B1
(45) Date of Patent: Dec. 31, 2019

(54) USING SOURCE/DRAIN CONTACT CAP DURING GATE CUT

(71) Applicant: GLOBALFOUNDRIES INC., Grand Cayman (KY)

(72) Inventors: Haiting Wang, Clifton Park, NY (US); Shesh Mani Pandey, Saratoga Springs, NY (US); Jiehui Shu, Clifton Park, NY (US); Laertis Economikos, Wappingers Falls, NY (US); Hui Zang, Guilderland, NY (US); Ruilong Xie, Schenectady, NY (US); Guowei Xu, Ballston Lake, NY (US); Zhaoying Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/032,108

(22) Filed: Jul. 11, 2018

(51) Int. Cl.
| | |
|---|---|
| *H01L 29/08* | (2006.01) |
| *H01L 27/088* | (2006.01) |
| *H01L 21/8234* | (2006.01) |
| *H01L 29/423* | (2006.01) |
| *H01L 29/66* | (2006.01) |
| *H01L 29/40* | (2006.01) |

(52) U.S. Cl.
CPC .. *H01L 27/0886* (2013.01); *H01L 21/823431* (2013.01); *H01L 21/823437* (2013.01); *H01L 29/401* (2013.01); *H01L 29/42356* (2013.01); *H01L 29/66545* (2013.01)

(58) Field of Classification Search
CPC .......... H01L 29/0866; H01L 21/82437; H01L 29/66545; H01L 29/42356; H01L 29/401
See application file for complete search history.

(56) References Cited

U.S. PATENT DOCUMENTS

| | | | |
|---|---|---|---|
| 8,377,795 B2 | 2/2013 | Kanakasabapathy et al. | |
| 9,064,932 B1 | 6/2015 | Pham et al. | |
| 9,373,641 B2 | 6/2016 | Anderson et al. | |
| 9,577,036 B1 | 2/2017 | Chang et al. | |
| 9,666,471 B2 | 5/2017 | Gan et al. | |
| 9,818,836 B1 | 11/2017 | Sung et al. | |
| 9,882,048 B2 | 1/2018 | Anderson et al. | |
| 10,236,213 B1 * | 3/2019 | Pandey | H01L 21/823437 |
| 2016/0133632 A1 | 5/2016 | Park et al. | |
| 2018/0269305 A1 * | 9/2018 | Bao | H01L 29/0847 |
| 2019/0067115 A1 * | 2/2019 | Park | H01L 21/823437 |

* cited by examiner

*Primary Examiner* — William Coleman
(74) *Attorney, Agent, or Firm* — Gibb & Riley, LLC; Francois Pagette

(57) ABSTRACT

Parallel fins are formed (in a first orientation), and source/drain structures are formed in or on the fins, where channel regions of the fins are between the source/drain structures. Parallel gate structures are formed to intersect the fins (in a second orientation perpendicular to the first orientation), source/drain contacts are formed on source/drain structures that are on opposite sides of the gate structures, and caps are formed on the source/drain contacts. After forming the caps, a gate cut structure is formed interrupting the portion of the gate structure that extends between adjacent fins. The upper portion of the gate cut structure includes extensions, where a first extension extends into one of the caps on a first side of the gate cut structure, and a second extension extends into the inter-gate insulator on a second side of the gate cut structure.

19 Claims, 12 Drawing Sheets

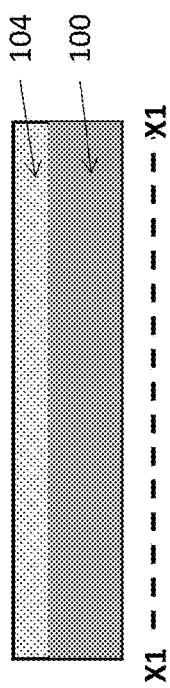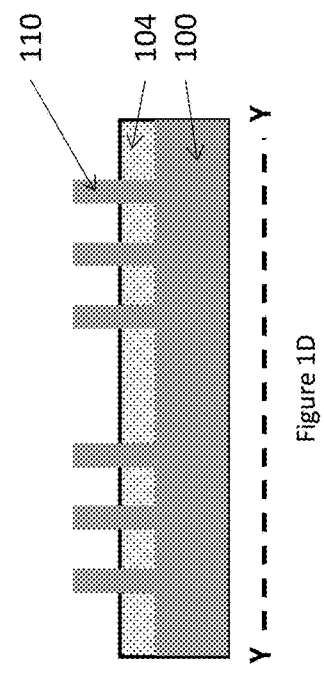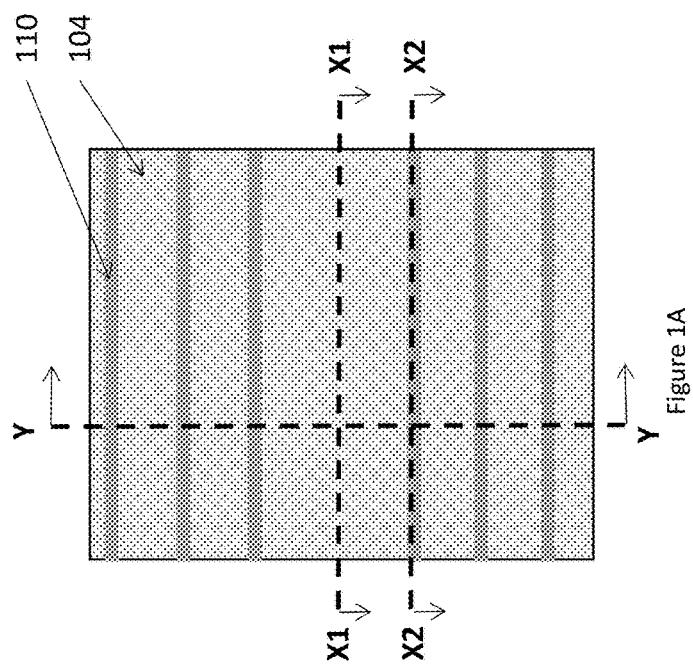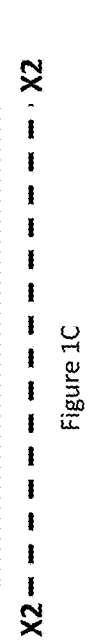
Figure 1A
Figure 1B
Figure 1C
Figure 1D

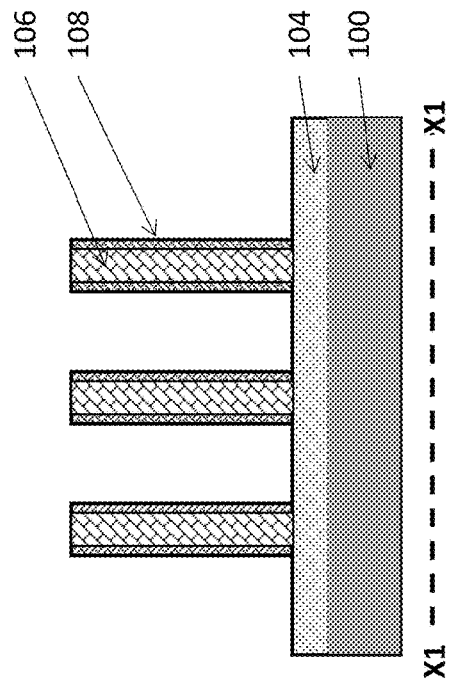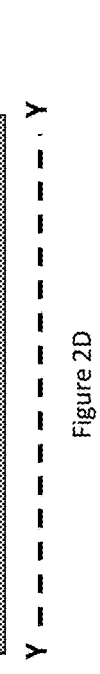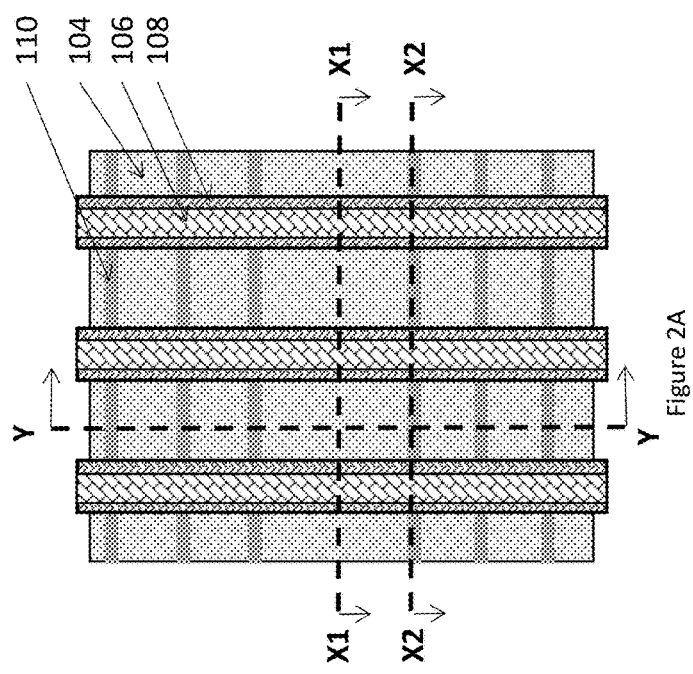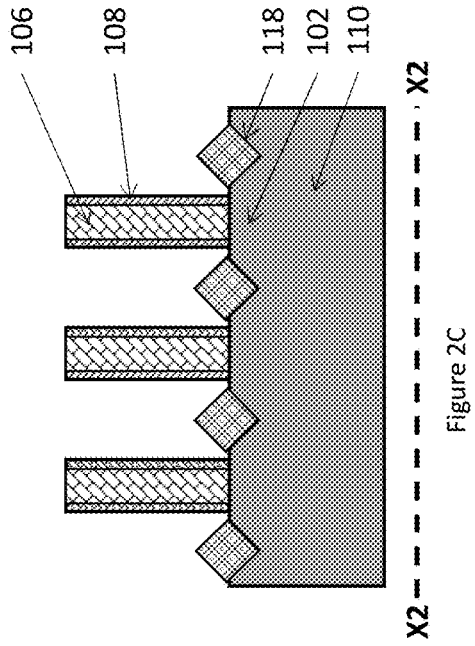

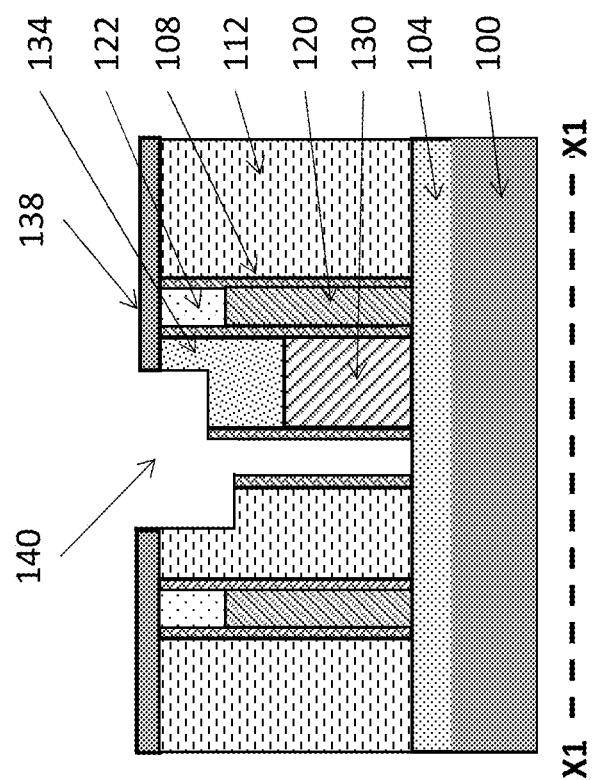
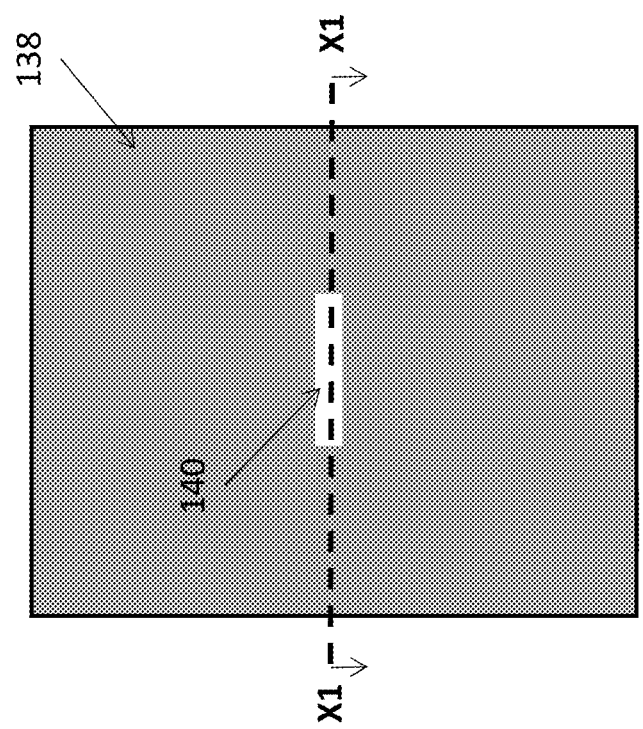
Figure 8B
Figure 8A

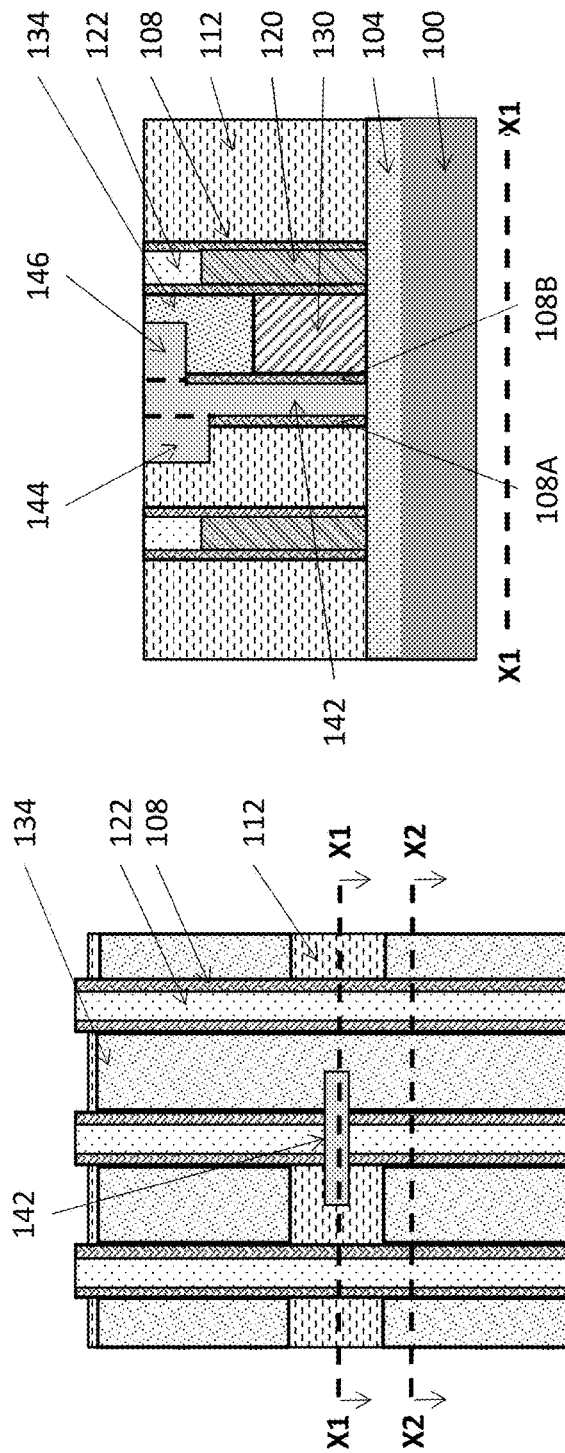
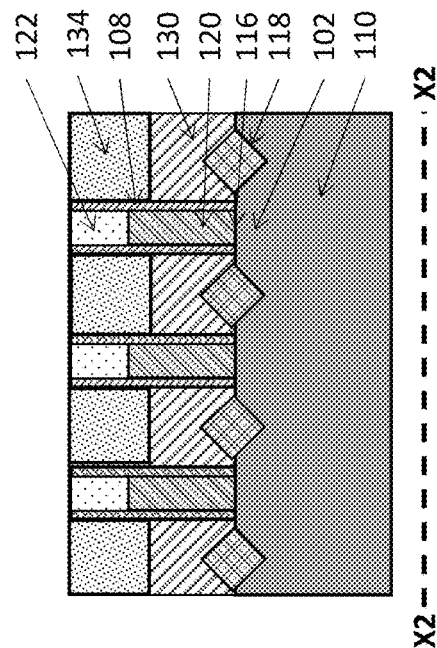
Figure 10A
Figure 10B
Figure 10C

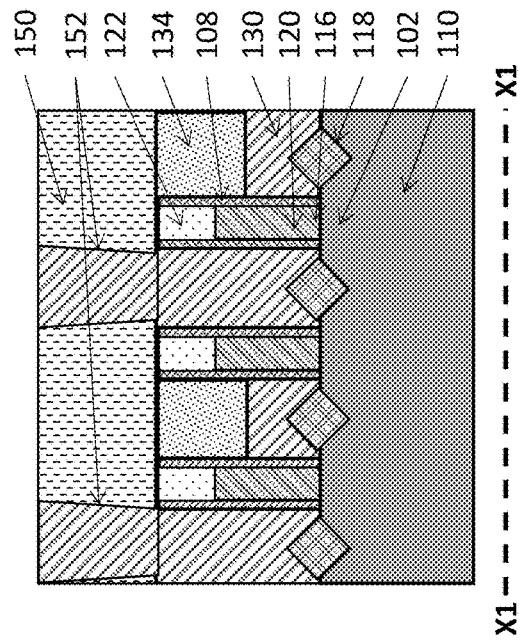
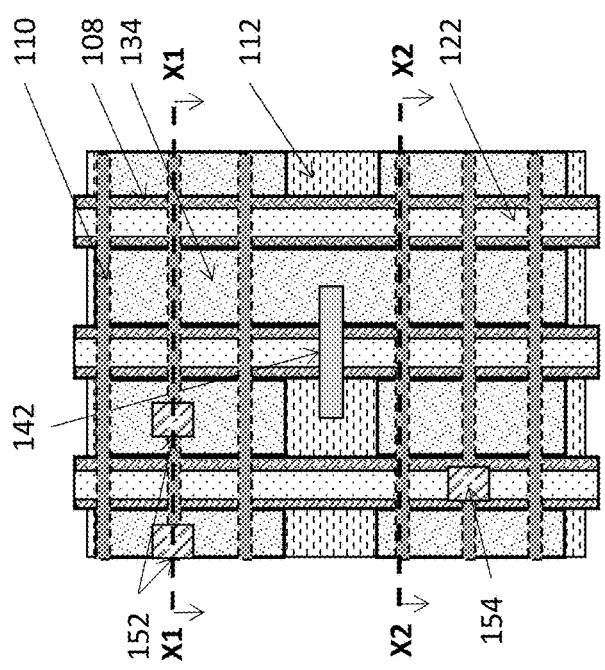
Figure 11A
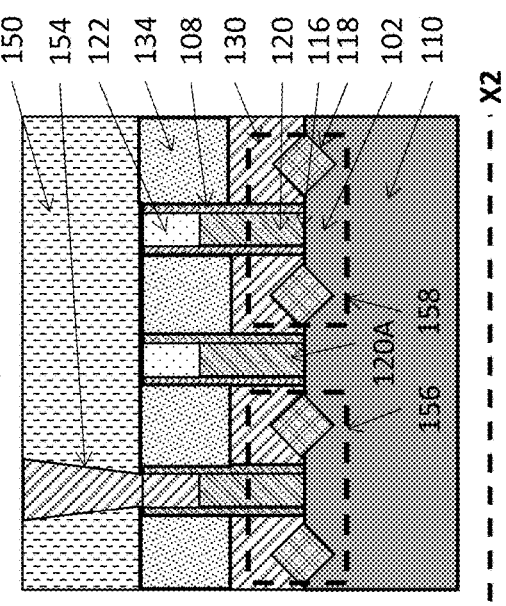
Figure 11B
Figure 11C

USING SOURCE/DRAIN CONTACT CAP DURING GATE CUT

BACKGROUND

Field of the Invention

The present disclosure relates to the integrated circuits and to processing for making such devices, and more specifically to processing that forms the gate cut after forming caps on source/drain contacts.

Description of Related Art

Integrated circuit devices use transistors for many different functions, and these transistors can take many different forms, from planar transistors, to transistors that use a "fin" style structure. A fin of a fin-type transistor is a thin, long, six-sided shape (that is somewhat rectangular) that extends from, or has a bottom surface that is part of, a substrate; with sides that are longer than they are wide, a top and bottom that have somewhat similar lengths as the sides (but that have widths that are much narrower) and ends that are approximately as tall from the substrate as the width of the sides, but that are only approximately as wide as the top and/or bottom. Rounding and uneven shaping can occur (especially at the corners and top) in such fin structures, and often such structures have a rounded, tapered shape; however, such structures are highly distinguishable from planar devices (even though both types of devices are highly useful).

In one example, an exemplary device can incorporate multiple parallel semiconductor fins, including at least one first semiconductor fin with a first channel region and first source/drain regions for at least one first-type FINFET (e.g., a P-type FINFET) and at least one second semiconductor fin with a second channel region and second source/drain regions for at least one second-type FINFET (e.g., an N-type FINFET). A first gate (e.g., a first replacement metal gate (RMG)) can traverse the first semiconductor fin at the first channel region and a second gate (e.g., a second replacement metal gate (RMG)) can be in end-to-end alignment with the first gate and can traverse the second semiconductor fin at the second channel region. Depending upon the cell design, the first gate and the second gate can be physically separated and electrically isolated from each other by a gate cut isolation region, which is positioned laterally between adjacent ends of the two gates in an area between the first semiconductor fin and the second semiconductor fin.

SUMMARY

Exemplary methods herein pattern a material into fins, and such fins have a top surface that is sometimes referred to as a layer or substrate. This fin layer can be or have a semiconductor channel region. Such processing forms a sacrificial elongated structure extending over such a channel region of the layer. Also, sidewall spacers are formed on the sacrificial elongated structure, and then such methods form source/drain structures in and/or on the layer on opposite sides of the sacrificial elongated structure. The source/drain structures are self-aligned by the spacers. These methods replace the sacrificial elongated structure with a gate structure (which can include a gate conductor over the channel region, and a stack insulator on the gate conductor). The gate structure includes a portion that extends beyond the channel region and is between the fins.

Further, such methods form source/drain contacts on the source/drain structures on opposite sides of the gate structure. The sidewall spacers on the gate structure electrically insulate the gate structure from the source/drain contacts. Also, the sacrificial elongated structure, the gate structure, and the source/drain contacts are elongated structures that extend in a "first" orientation or direction. The layer formed by the fin, and the source/drain structures formed in/on the layer are aligned across the channel region in a "second" orientation that is perpendicular to the first orientation. Further, the portion of the gate structure that extends beyond the channel region and is between the fins extends from the channel region in the first orientation.

These methods reduce the height of the source/drain contacts (such that the gate structure extends further from the layer than do the source/drain contacts) thereby creating a recess, and this allows these methods to form caps on the source/drain structures in such recesses. After forming these caps, the methods herein form a gate cut structure (e.g., an insulator that extends completely through the gate structure). The gate cut structure interrupts the portion of the gate structure that extends beyond the channel region and is between the fins. The process of forming the gate cut structure includes processes of removing the portion of the gate structure that extends beyond the channel region to create a cut recess, and forming a cut insulator in the cut recess. The caps protect the source/drain structure during the process of removing the portion of the gate structure that extends beyond the channel region. The cut insulator electrically insulates one portion of the gate structure from another portion of the gate structure.

Such processing produces a number of exemplary structures, and such structures include parallel fins (e.g., a layer or substrate) extending from a lower material (in a first orientation), source/drain structures in or on the fin, where a channel region of the fin is between the source/drain structures. Parallel gate structures intersect the fins (in a second orientation perpendicular to the first orientation), and parallel source/drain contacts (in the second orientation) are between the gate structures. The source/drain contacts are discontinuous and are interrupted by an inter-gate insulator.

Further, caps are on the source/drain contacts between the gate structures (e.g., the source/drain contacts are between the caps and the fin layer). Also, a gate cut structure interrupts at least one of the gate structures. The caps can be a different insulator material from the gate cut structure.

The gate cut structure has a T-shape, and therefore has a lower portion extending to the layer, and a larger upper portion (the lower portion is between the layer and the upper portion). The upper portion of the gate cut structure includes extensions (oriented in the first orientation) that form the T-shape. The extensions extend a distance from the gate cut structure that is less than a distance between the gate structures.

More specifically, a first extension of the upper portion of the gate cut structure extends into one of the caps on the source/drain contacts on a first side of the gate cut structure, and a second extension of the upper portion of the gate cut structure extends into the inter-gate insulator on a second side of the gate cut structure (opposite the first side of the gate cut structure).

However, the first extension that extends into one of the caps is thinner (in a direction perpendicular to the layer of the fin) than the second extension that extends into the inter-gate insulator. Stated differently, the first extension and the second extension have top surfaces that are co-planar (e.g., are within a first plane), while the first extension has a first bottom surface opposite the top surfaces in a second plane different from the first plane, and the second extension has a second bottom surface opposite the top surfaces in a third plane different from the first plane and the second plane. The distance between the first bottom surface and the top surfaces is less than the distance between the second bottom surface and the top surfaces.

Consistent with the different thickness extensions of the upper portion of the gate cut structure, a first sidewall spacer (that is on the lower portion of the first side of the gate cut structure) extends a first distance that is further from the layer relative to second distance a second sidewall spacer (that is on the lower portion of the second side of the gate cut structure) extends from the layer.

Such a gate cut structure interrupts a first gate that is between second and third gates (of the gate structures). The corresponding cap and source/drain contact is between the first gate and the second gate, and the inter-gate insulator is between the first gate and the third gate (where the gate cut structure is located).

BRIEF DESCRIPTION OF THE DRAWINGS

The embodiments herein will be better understood from the following detailed description with reference to the drawings, which are not necessarily drawn to scale and in which:

FIG. 1A is a top (plan) view conceptual schematic diagram of an integrated circuit structure according to embodiments herein;

FIG. 1B is a cross-sectional view conceptual schematic diagram along line X1-X1 in FIG. 1A of an integrated circuit structure according to embodiments herein;

FIG. 1C is a cross-sectional view conceptual schematic diagram along line X2-X2 in FIG. 1A of an integrated circuit structure according to embodiments herein;

FIG. 1D is a cross-sectional view conceptual schematic diagram along line Y-Y in FIG. 1A of an integrated circuit structure according to embodiments herein;

FIGS. 2A-2D are conceptual schematic diagrams of manufacturing stages of integrated circuit structures corresponding the views shown in FIG. 1A-1D, respectively;

FIGS. 8A-8B are conceptual schematic diagrams of manufacturing stages of integrated circuit structures corresponding the views shown in FIG. 1A-1B, respectively;

FIGS. 10A-10C are conceptual schematic diagrams of manufacturing stages of integrated circuit structures corresponding the views shown in FIG. 1A-1C, respectively;

FIG. 11A is a top (plan) view conceptual schematic diagram of an integrated circuit structure according to embodiments herein;

FIG. 11B is a cross-sectional view conceptual schematic diagram along line X1-X1 in FIG. 11A of an integrated circuit structure according to embodiments herein;

FIG. 11C is a cross-sectional view conceptual schematic diagram along line X2-X2 in FIG. 11A of an integrated circuit structure according to embodiments herein.

DETAILED DESCRIPTION

Figure 3B:
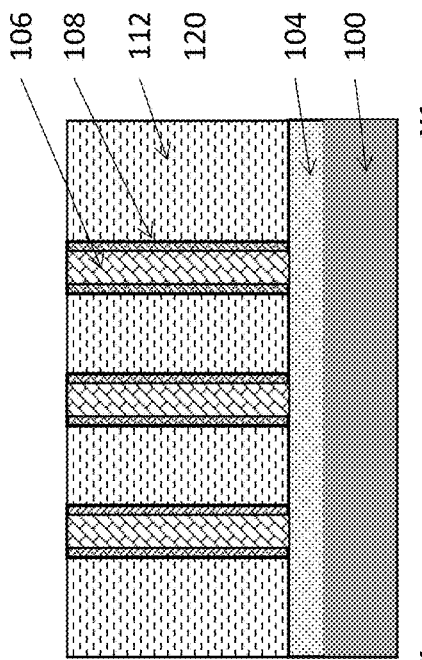
FIGS. 3A-3D are conceptual schematic diagrams of manufacturing stages of integrated circuit structures corresponding the views shown in FIG. 1A-1D, respectively.
Figure 3D:
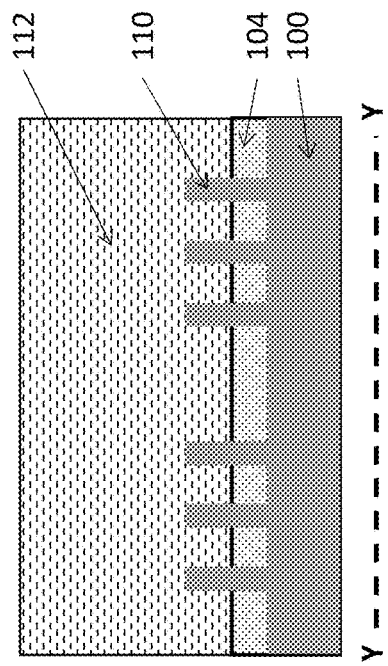
Figure 3A:
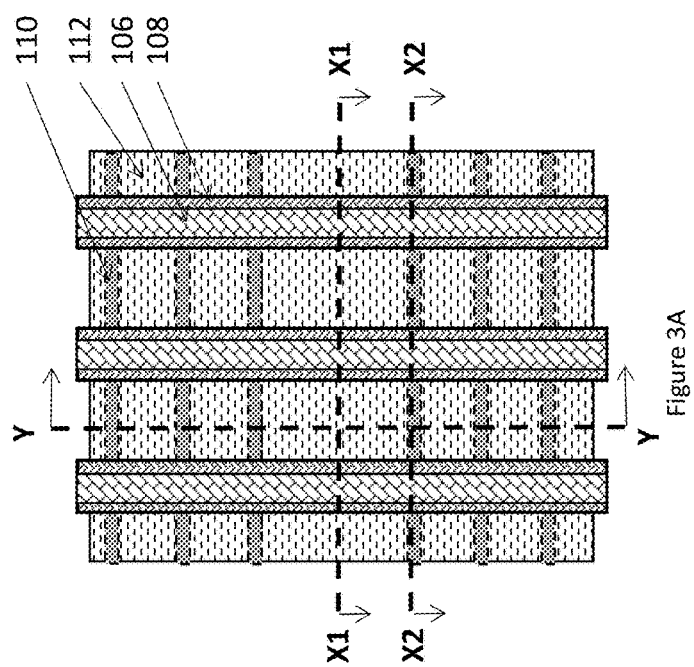
Figure 3C:
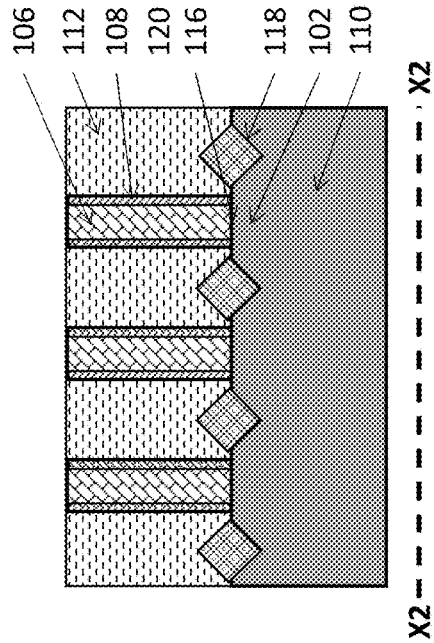

As noted above, sections of a linear gate can be physically separated and electrically isolated from each other by a gate cut isolation region, which is positioned laterally between adjacent ends of two gate portions in an area between semiconductor fins. Generally, gate cuts are formed by removing (etching) a portion of a linear gate that is located between fins, and forming an insulator in the cut that is created, to electrically isolate the different sections of the otherwise continuous linear gate.

However, during the process of removing the portion of the gate to create the cut, if large portions of the inter-fin insulator are removed, the later-formed gate cut insulator can block the formation of contacts to the source/drain contacts. This is especially problematic because the insulator used for the gate cut (e.g., silicon nitride) is much more etch resistant than the inter-fin insulator (e.g., silicon oxide); and the etching process used to form the source/drain contacts may not sufficiently remove the gate cut insulator to reliably form source/drain contacts.

Alternatively, the gate cut can be made after the source/drain contacts are formed to avoid blocking the proper formation of the source/drain contacts. However, if attempts are made to form the gate cut after the source/drain contacts are already in place, the process of removing the gate conductor (to cut the gate) can undesirably also remove portions of the source/drain contacts, even if very highly selective etching processing and materials are utilized.

In view of the foregoing, the processing herein forms the source/drain contacts before forming the gate cut (to avoid having later-formed source/drain contacts be blocked by excessive amounts of gate cut insulator); however, the methods herein form a cap over the source/drain contacts to prevent the removal (cut) of the gate from also removing the previously-formed source/drain contacts. More specifically, the processing herein first forms the source/drain contacts, then recesses the source/drain contacts, and then form protective caps on the source drain contacts. Once the source/drain contacts and their protective caps are in place, the processing herein removes the selected portion of the gate conductor (while the source/drain caps protect the source/drain contacts) and fills the cut thus formed with an insulator. Such processing produces a T-shaped gate cut (that has a top portion parallel to the fins) that has an unevenly formed top portion where one thicker end of the top of the T extends into the inter-fin insulator, while the other thinner end of the top of the T extends into the source/drain contact cap.

Not only does the processing herein reliably form the gate cut isolation structure without damaging or blocking the source/drain contacts, such also allows a wider choice of materials to be used for the source/drain contacts. In one example, because the source/drain contacts are protected by their respective caps, very similar materials can be used for both the gate conductor and source/drain contacts because these two items would not be etched selectively to one another. Also, the cap can be formed of a material that is highly resistant to etching (e.g., silicon carbon, etc.) and can be formed of materials that are selectively removed relative to the gate cut insulators (e.g., silicon nitride, etc.) allowing conductive vias to be selectively formed to either the gate conductors or the source/drain contacts, without affecting the other.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures can, in one example, be formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. Isolation structures are generally formed using highly insulating material (this allows different active areas of the substrate to be electrically isolated from one another). Also, a hardmask can be formed of any suitable material, whether now known or developed in the future, such as a nitride, metal, or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

For purposes herein, "sidewall spacers" are structures are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

FIGS. 1A-11C use an example that shows field effect transistors (FETs), and more specifically fin-type FETs (FinFETs). While only one type or a limited number of transistor types are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

FIGS. 1A-1D illustrate one example of a partially formed FinFET structure. More specifically, FIG. 1A is a top (plan) view conceptual schematic diagram of an integrated circuit structure according to embodiments herein, FIG. 1B is a cross-sectional view conceptual schematic diagram of the same along line X1-X1 in FIG. 1A, FIG. 1C is a cross-sectional view conceptual schematic diagram along line X2-X2 in FIG. 1A, and FIG. 1D is a cross-sectional view conceptual schematic diagram along line Y-Y in FIG. 1A.

To form the structures shown in FIGS. 1A-1D, different processing can be used. In some exemplary methods, a layer 100 (of in situ formed, or later doped, semiconductor material) is patterned into fins 110 as shown in FIG. 1D. As shown in FIG. 1C, this forms a "first" layer or substrate structure (e.g., fins 110). Note that while the first layer 110 can be a fin structure, it does not need to be, and the first layer 110 can, in some implementations, simply be a planar layer. Therefore, the fins 110 are sometimes generically referred to herein simply as a layer or substrate 110. As can be seen in FIG. 1D, an insulator or isolation material 104 can be formed and reduced in height to reveal the fins 110.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed (grown or deposited) from any of the many candidate low dielectric constant materials (low-K (where K corresponds to the dielectric constant of silicon dioxide) materials such as fluorine or carbon-doped silicon dioxide, porous silicon dioxide, porous carbon-doped silicon dioxide, spin-on silicon or organic polymeric dielectrics, etc.) or high dielectric constant (high-K) materials, including but not limited to silicon nitride, silicon oxynitride, a gate dielectric stack of $SiO_2$ and $Si_3N_4$, hafnium oxide ($HfO_2$), hafnium zirconium oxide ($HfZrO_2$), zirconium dioxide ($ZrO_2$), hafnium silicon oxynitride (HfSiON), hafnium aluminum oxide compounds ($HfAlO_x$), other metal oxides like tantalum oxide, etc. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, polysilicon-germanium, rendered conductive by the presence of a suitable dopant, etc. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art. Further, some conductors herein can be partially or fully formed of a metal having a specific work function. The work function of the conductor can be selected to use a specific amount of energy to remove an electron from the solid material, and thereby enhance transistor performance.

FIGS. 2A-2D show the same views as FIGS. 1A-1D mentioned above. As shown in FIGS. 2A-2D, such processing forms sacrificial elongated structures 106 (which are commonly referred to as "dummy" gates) extending over the channel regions 102 of the fin layer 110 (e.g., see FIG. 2C). Also, sidewall spacers 108 are formed on the sacrificial elongated structures 106. Such methods form source/drain structures 118 (using, for example, epitaxial growth or implantation processes) in and/or on the fin layer 110 on opposite sides of the sacrificial elongated structures 106. The source/drain structures 118 are self-aligned in the epitaxial growth process by the sidewall spacers 108.

FIGS. 3A-3D show the same relative views as FIGS. 1A-1D mentioned above. As shown in FIGS. 3A-3D, such processing forms a protective insulator layer 112 (e.g., oxides, etc.) over the source/drain regions 118. Also note that in FIGS. 3A-3D, the fins are shown through the insulator layer 112 (and are therefore shown using dashed lines).

Figure 4B:
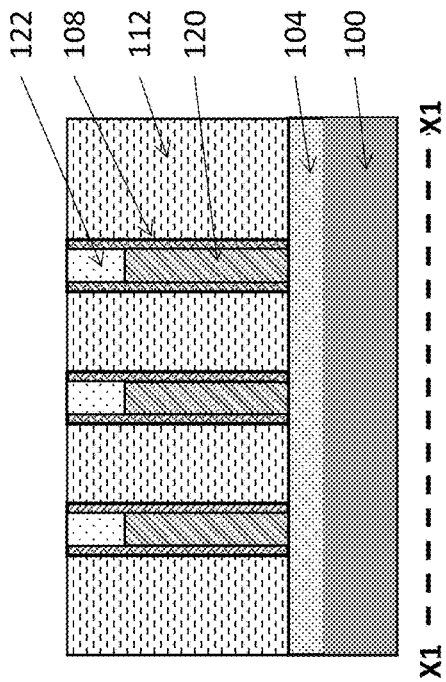
FIGS. 4A-4D are conceptual schematic diagrams of manufacturing stages of integrated circuit structures corresponding the views shown in FIG. 1A-1D, respectively.
Figure 4D:
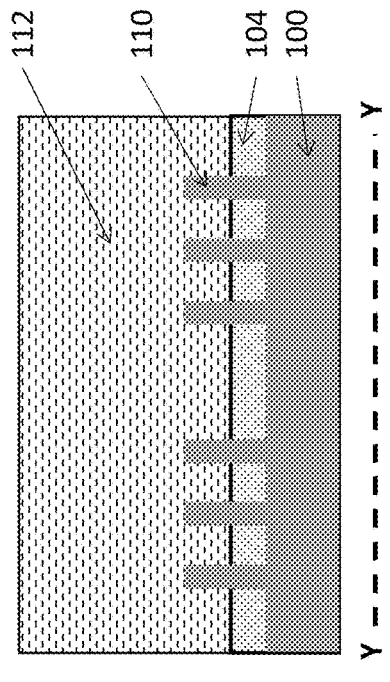
Figure 4A:
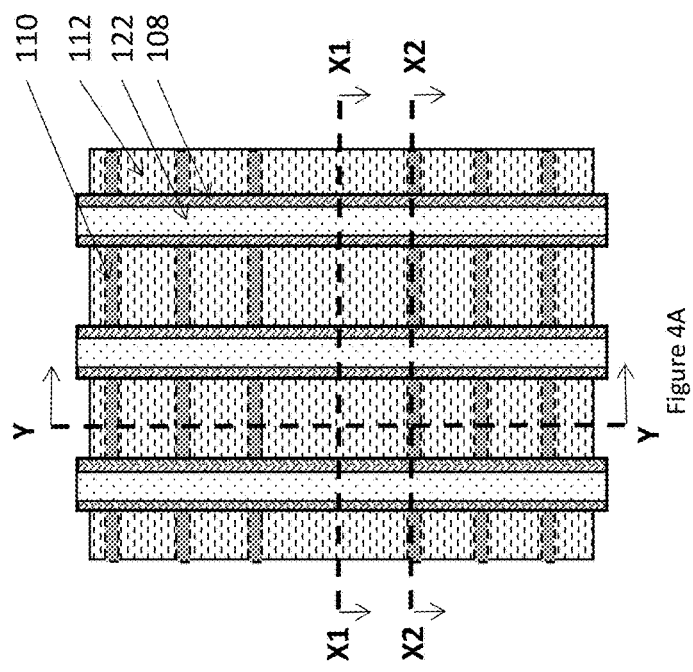
Figure 4C:
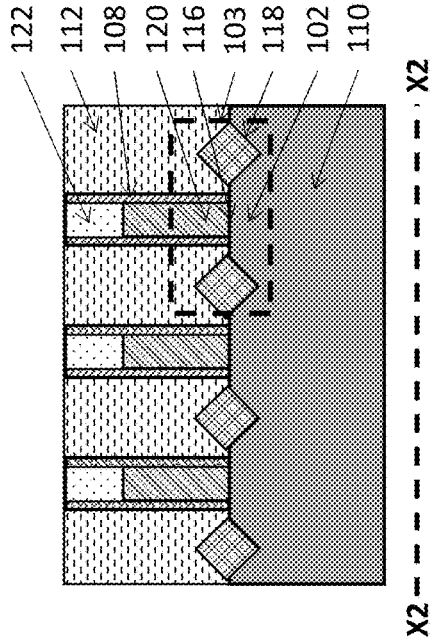

FIGS. 4A-4D show the same views as FIGS. 1A-1D mentioned above. In FIGS. 4A-4D, these methods remove the sacrificial elongated structures 106 (but leave the sidewall spacers 108 and protective insulator 112 in place). As shown in FIG. 4C, a gate insulator 116 (e.g., gate oxide) can be deposited or grown on (directly contacting) the channel region 102 of the fin layer 110. The sacrificial elongated structures 106 are then replaced with a gate structure 120, 122 (which can include a gate conductor 120 and a stack insulator 122 on the gate conductor 120). Therefore, as shown in FIG. 4C, gate conductors 120 (which can be one or more specific work function metals) are formed on (over, directly contacting) the gate insulators 116. Additionally, insulators 122 (such as silicon nitride) are formed on (over, directly contacting) the gate conductors 120, and such insulators are sometimes referred to herein as "stack" insulators 122, and this thereby forms gate stacks 120, 122.

As shown in FIGS. 4A-4C, the previously formed sidewall spacers 108 (e.g., low-k insulators) are positioned along (laterally adjacent to, directly contacting) the gate stacks 120, 122. As also shown in FIGS. 4A and 4B, because the elongated gate structures 120, 122 intersect many fins 110, the gate structure 120, 122 includes at least one portion that extends beyond the channel region 102 and is formed on the insulator 104 between the fins 110.

In one example, FIG. 4C illustrates a field effect transistor 103 that includes a channel region 102, source/drain regions 118 on the sides of the channel region 102, a gate oxide (insulator) 116, and a gate (conductor) 120. As is explained above, voltage in the gate 120 changes the conductivity of the channel 102 allowing or preventing current from flowing between the source/drains 118.

The sidewall spacers 108 can be seen on opposite sides of the gate stacks 120, 122, in FIGS. 4A-4C. Further, FIGS. 4A-4C illustrates that the fins 110 are elongated (having a length longer than their width) approximately parallel structures, and similarly the gate stacks 120, 122 are elongated approximately parallel structures. Also, FIG. 4A illustrates that the fins 110 run in a direction (orientation) that is approximately perpendicular to the orientation of the gate stacks 120, 122.

FIGS. 5A-5D show the same views as FIGS. 1A-1D mentioned above. As shown in FIGS. 5A-5D, such methods form source/drain contacts 130 on the source/drain structures 118 on opposite sides of the gate structure 120, 122. For example, portions of the insulator 112 are removed (using etching through a patterned mask, etc.) and a conductor 130 is formed in the resultant openings.

Figure 5A:
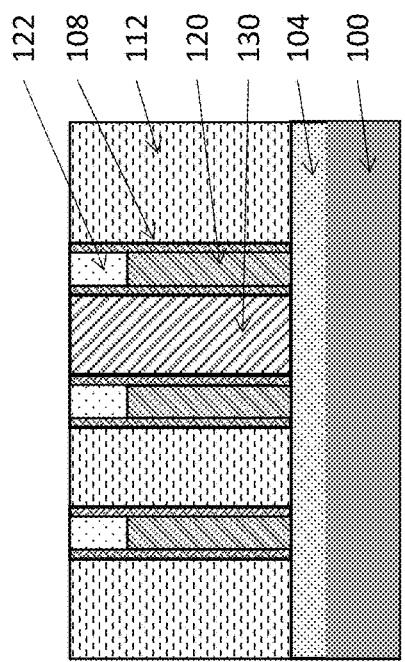
FIGS. 5A-5D are conceptual schematic diagrams of manufacturing stages of integrated circuit structures corresponding the views shown in FIG. 1A-1D, respectively.
Figure 5B:
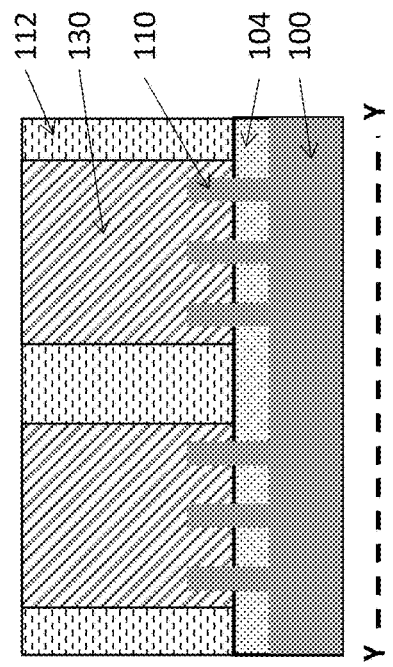
Figure 5C:
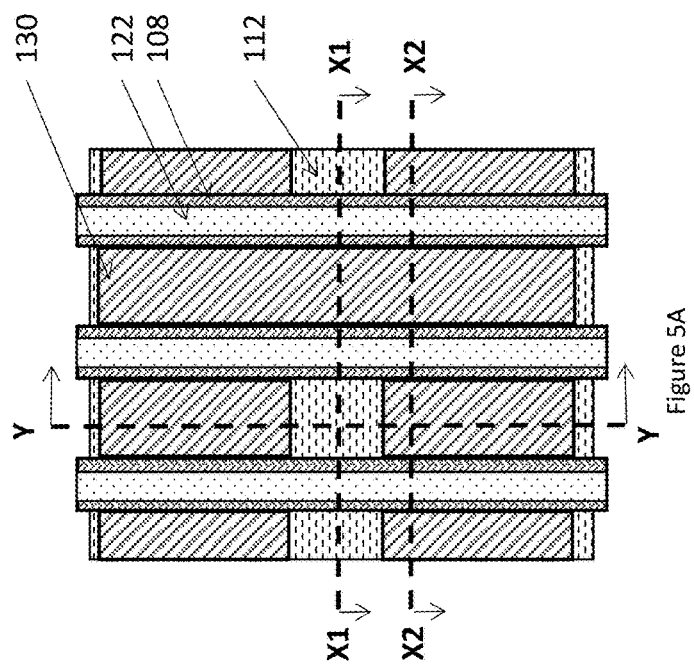
Figure 5D:
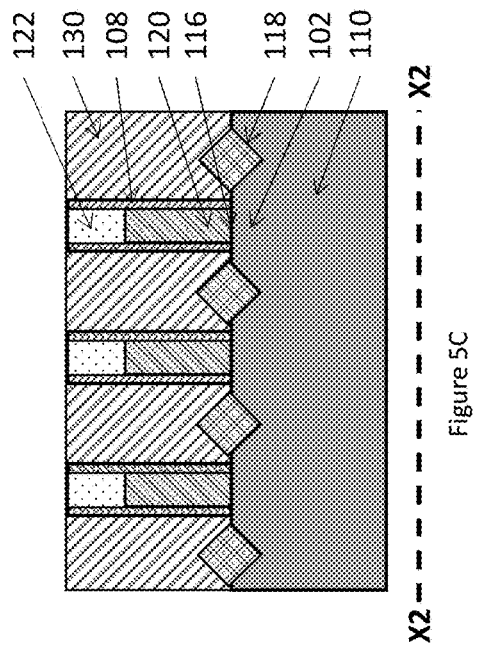

Note that the pattern of source/drain contacts 130 shown in FIG. 5A includes a source/drain contact 130 at every source/drain structure 118 along the fin 110; however, less source/drain contacts 130 run between the fins 110 as shown in FIGS. 5A and 5B. The sidewall spacers 108 on the gate structure 120, 122 electrically insulate the gate structure 120, 122 from the source/drain contacts 130.

Also, as can be seen in such drawings, the sacrificial elongated structure 106, the gate structure 120, 122, and the source/drain contacts 130 are elongated structures that extend in a "first" orientation or direction. The layer formed by the fin 110 is in a "second" orientation, that is perpendicular to the first orientation, and the source/drain structures 118 formed in/on the layer 110 are aligned across the channel region 102 is also in the second orientation. Here, both the first and second orientations are parallel to the top surface of the fin 110. Further, the portion of the gate structure 120, 122 that extends beyond the channel region 102 and is between the fins 110 extends from the channel region 102 in the first orientation.

Figure 6A:
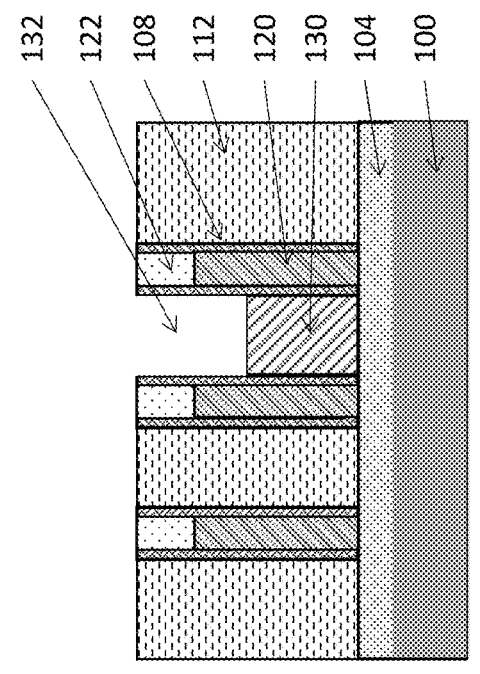
FIGS. 6A-6D are conceptual schematic diagrams of manufacturing stages of integrated circuit structures corresponding the views shown in FIG. 1A-1D, respectively.
Figure 6B:
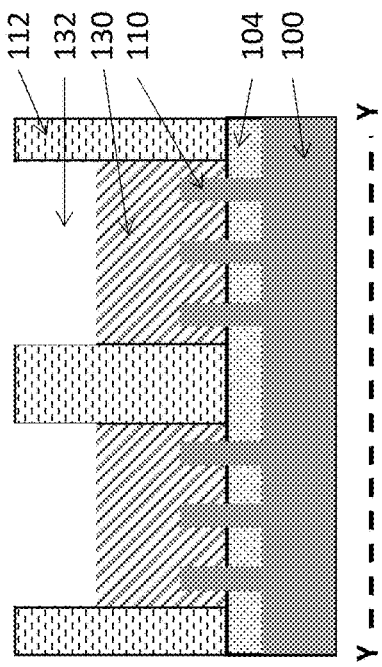
Figure 6C:
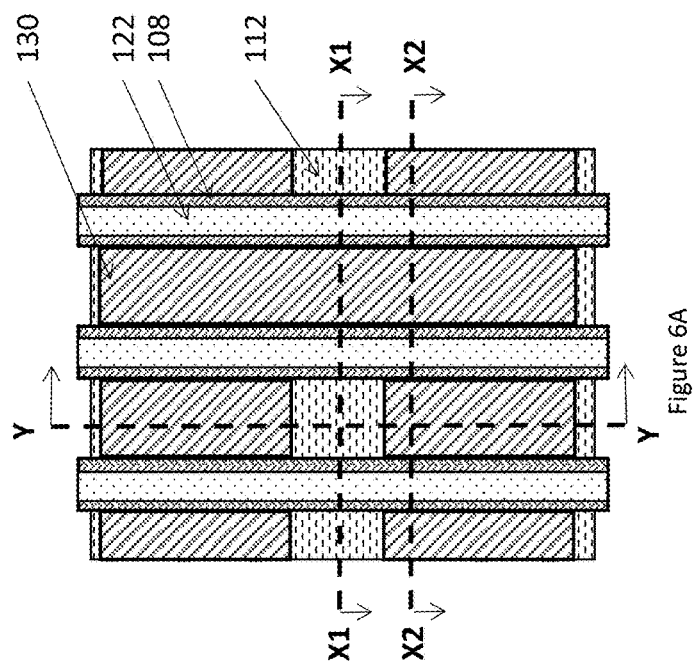
Figure 6D:
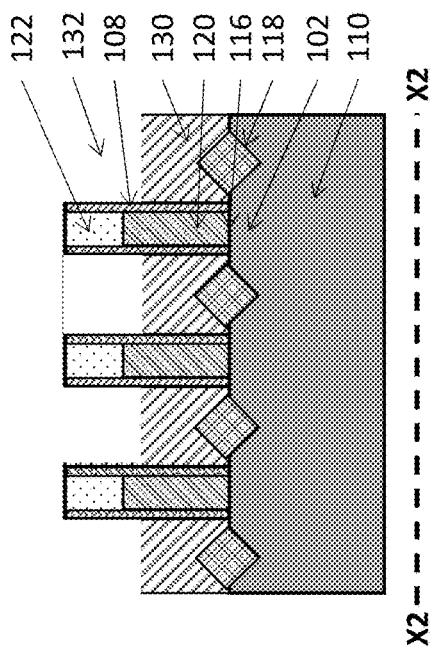
Figure 7A:
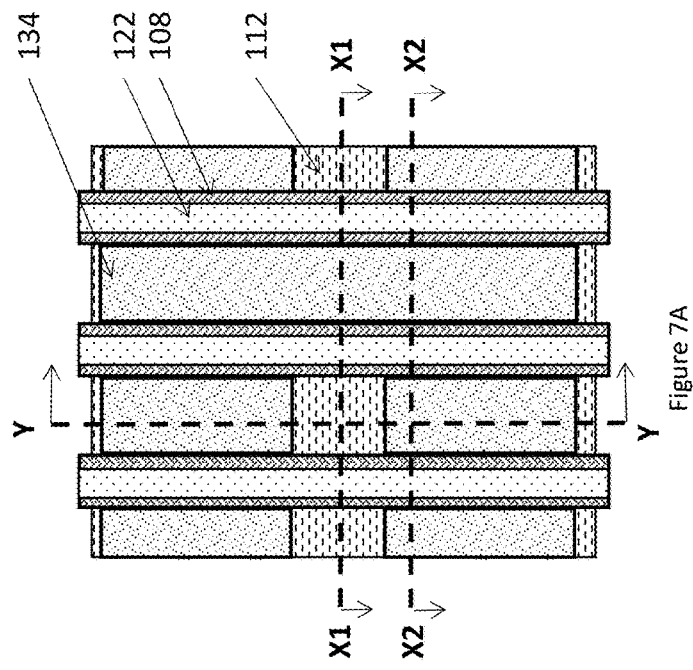
FIGS. 7A-7D are conceptual schematic diagrams of manufacturing stages of integrated circuit structures corresponding the views shown in FIG. 1A-1D, respectively.
Figure 7B:
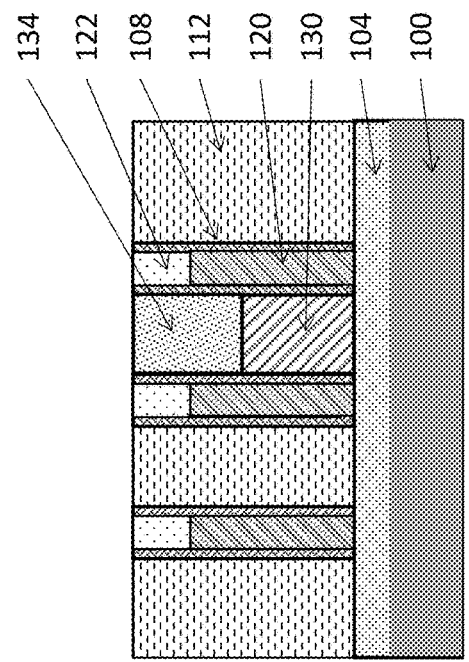
Figure 7C:
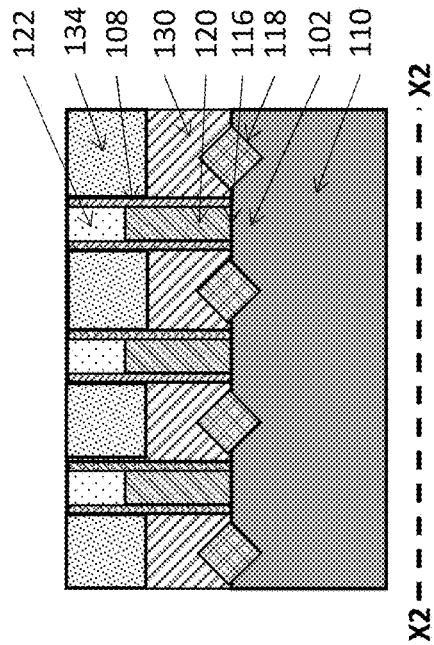
Figure 7D:
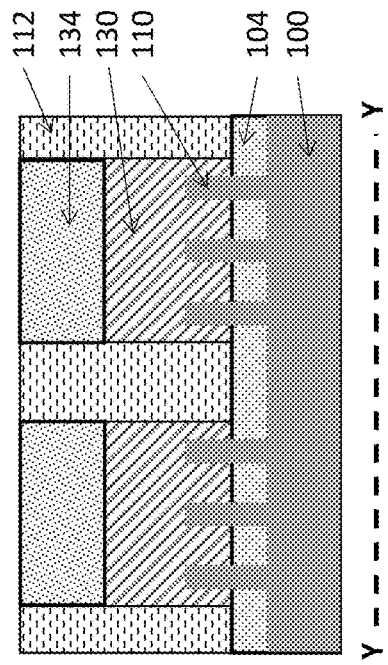

FIGS. 6A-6D show the same views as FIGS. 1A-1D mentioned above. As shown in FIGS. 6A-6D, such methods reduce the height of the source/drain contacts 130. This height reduction can be accomplished using masking and etching, or through wet removal processing that selectively attacks only the source/drain contact material 130. After such height reduction, the gate structure 120, 122 extends further from the layer 110 than do the source/drain contacts 130, thereby creating a recess 132 as shown in FIGS. 6B-6D.

FIGS. 7A-7D show the same views as FIGS. 1A-1D mentioned above. As shown in FIGS. 7A-7D, these methods form caps 134 (e.g., silicon carbon, etc.) on the source/drain structures 118 in such recesses 132 using deposition or growth processes, potentially followed by planarization processes, such as chemical mechanical polishing (CMP).

FIGS. 8A-8B show the same views as FIGS. 1A-1B mentioned above, and views corresponding to 1C and 1D are not illustrated as such structures are not affected in the processing shown in FIGS. 8A-8B. As shown in FIGS. 8A-8B, after forming the caps 134, the methods herein pattern a mask 138 (e.g., photolithographically). One or more material removal processes (e.g., etching, etc.) are used to remove material through the openings in the mask 138 to create a recess or "cut" 140 in one or more of the gate conductor structures 120, 122. This removes the portion of the gate structure 120, 122 that extends beyond (is between) the channel regions of the fins. The caps 134 protect the source/drain contacts 130 during the process of removing the portion of the gate structure 120, 122 that extends beyond the channel region.

Such processing shown in FIGS. 8A-8B removes all of the gate conductor structures 120, 122 down to the insulator layer 104, which exposes the insulator layer 104. This process can also remove portions of the insulator layer 112 and the source/drain caps 134. Note that etching processes may remove such different materials 112, 134, etc., at different rates, creating a T-shaped cut opening 140 with an uneven top portion (where the insulator layer 112 and source/drain caps 134 are recessed to different depths, relative to the fin 110).

Figure 9B:
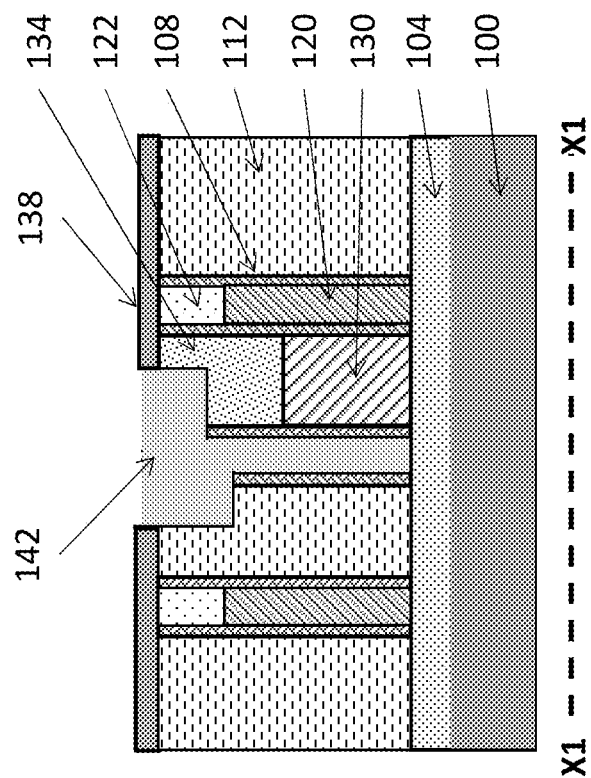
FIGS. 9A-9B are conceptual schematic diagrams of manufacturing stages of integrated circuit structures corresponding the views shown in FIG. 1A-1B, respectively.
Figure 9A:
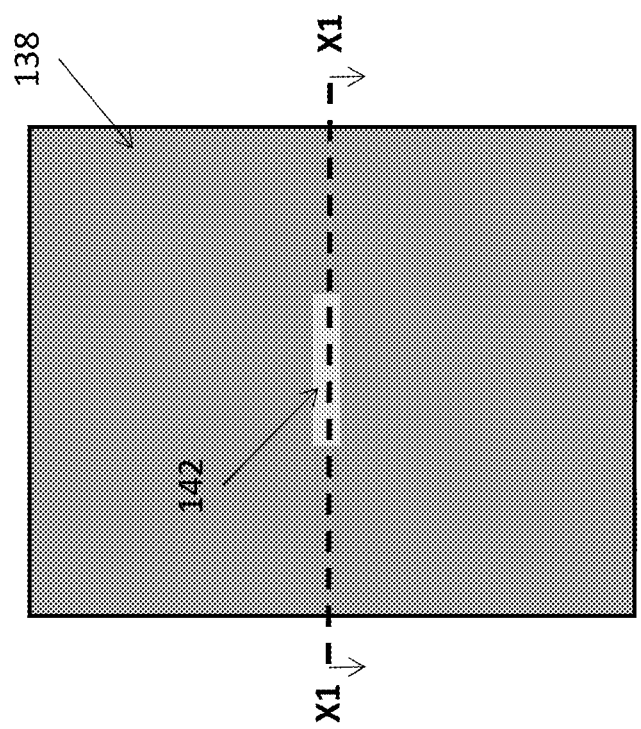

FIGS. 9A-9B show the same views as FIGS. 1A-1B mentioned above, and again views corresponding to 1C and 1D are not illustrated as such structures are not affected in the processing shown in FIGS. 9A-9B. As shown in FIGS. 9A-9B, this processing deposits or grows an insulator to form a gate cut structure 142 (e.g., an insulator that extends completely through the gate structure 120, 122 to the insulator layer 104) that divides the affected gate conductor 120 into separate sections, effectively creating two different and electrically separated gate conductors that are divided by an electrical insulator.

FIGS. 10A-10B show the same views as FIGS. 9A-9B with the mask 138 removed. FIG. 10C is a repeat of FIG. 7C and is included to show the position of the channel regions 102. The gate cut structure 142 shown in FIGS. 10A-10C interrupts the portion of the gate structure 120, 122 that extends beyond (is between) the channel region 102 and is between the fins 110. The gate cut structure 142 thus electrically insulates one portion of the gate structure 120, 122 that is on one side of the gate cut structure 142 (e.g., a first gate) from another portion of the gate structure 120, 122 that is on the other side of the gate cut structure 142 (e.g., a second gate).

As also shown in FIG. 10B, the gate cut structure 142 has a T-shape when viewed in cross-section in an orientation parallel to the fins 110. Therefore, the T-shaped gate cut structure 142 has a lower portion 142 extending to the top surface of the insulator 104, and a larger (or wider) upper portion 144, 146 distal to the insulator 104 (the lower portion 142 is between the insulator 104 and the upper portion 144, 146). The upper portion 144, 146 of the gate cut structure 142 includes extensions (oriented in the first orientation) that form the top of the T-shape. The extensions extend in a direction parallel to the length of the fins 110 (respectively toward each of the laterally adjacent gate structures 120, 122) a distance from the gate cut structure 142 that is less than a distance between adjacent gate structures 120, 122 (for example, the extensions 144, 146 may extend 25%, 33%, 50%, 75%, of the way to the next most laterally adjacent gate structure 120, 122).

More specifically, a first extension 146 of the upper portion 144, 146 of the gate cut structure 142 extends into one of the caps 134 on the source/drain contacts 130 on a first side of the gate cut structure 142, and a second extension 144 of the upper portion 144, 146 of the gate cut structure 142 extends into the inter-gate insulator on a second side of the gate cut structure 142 (opposite the first side of the gate cut structure 142).

However, the first extension 146 that extends into one of the caps 134 is thinner (in a direction perpendicular to the top layer of the fins 110) than the second extension 144 that extends into the inter-gate insulator. Stated differently, the first extension 146 and the second extension 144 have top surfaces distal to the insulator 104 that are co-planar (e.g., are within a first plane), while the first extension 146 has a first bottom surface opposite the top surfaces in a second plane different from the first plane, and the second extension 144 has a second bottom surface opposite the top surfaces in a third plane different from the first plane and the second plane. The distance between the first bottom surface and the top surfaces is less than the distance between the second bottom surface and the top surfaces.

Consistent with the different thickness extensions of the upper portion 144, 146 of the gate cut structure 142, a first sidewall spacer 108B (that is on the lower portion 142 of the first side of the gate cut structure 142) extends a first distance that is further from insulator 104 relative to second distance a second sidewall spacer 108A (that is on the lower portion 142 of the second side of the gate cut structure 142) extends from insulator 104.

FIG. 11A shows the same views as FIG. 1A, FIG. 11B is a cross-sectional view conceptual schematic diagram of the same along line X1-X1 in FIG. 11A, FIG. 11C is a cross-sectional view conceptual schematic diagram along line X2-X2 in FIG. 11A. Note that FIG. 11A shows the fins 110 through the overlying structures to show the fin 110 positions, but uses dashed lines to indicate such a see-through view.

In FIGS. 11A-11C an interlayer dielectric (ILD) 150 is deposited or grown, and via openings are patterned through the ILD 150. Such via openings are subsequently filled with conductors to create via contacts, including source/drain via contacts 152 (FIGS. 11A and 11B) and gate via contacts 154 (FIGS. 11A and 11C). Also, as can be seen in FIG. 11C, because the center gate conductor 120A has been cut by the gate cut structure 142 (FIG. 11A) it is electrically inactive; and this allows two transistors 156, 158 to each include source/drains 118, channel 102, and gate 120 that are electrically isolated from each other by the electrically inactive gate conductor 120A.

Therefore, such processing produces exemplary structures (one of which is shown in FIGS. 11A-11C) that include parallel fins 110 (e.g., a layer or substrate) extending from a lower material (in a first orientation), source/drain structures 118 in or on the fins 110, where a channel region 102 of the fins 110 is between the source/drain structures 118. Parallel gate structures 120, 122 intersect the fins 110 (in a second orientation perpendicular to the first orientation), and parallel source/drain contacts 130 (in the second orientation) are between the gate structures 120, 122. The source/drain contacts 130 are discontinuous and are interrupted by an inter-gate insulator 112. Further, caps 134 are on the source/drain contacts 130 between the gate structures 120, 122 (e.g., the source/drain contacts 130 are between the caps 134 and the fin layer). Also, a gate cut structure 142 interrupts at least one of the gate structures 120, 122. The caps 134 can be a different insulator material from the gate cut structure 142.

Such a gate cut structure 142 interrupts a first gate 120A that is between second and third gates (of the gate structures 120, 122). The corresponding cap 134 and source/drain contact 130 is between the first gate and the second gate, and the inter-gate insulator 122 is between the first gate and the third gate (where the gate cut structure 142 is located).

Figure 12:
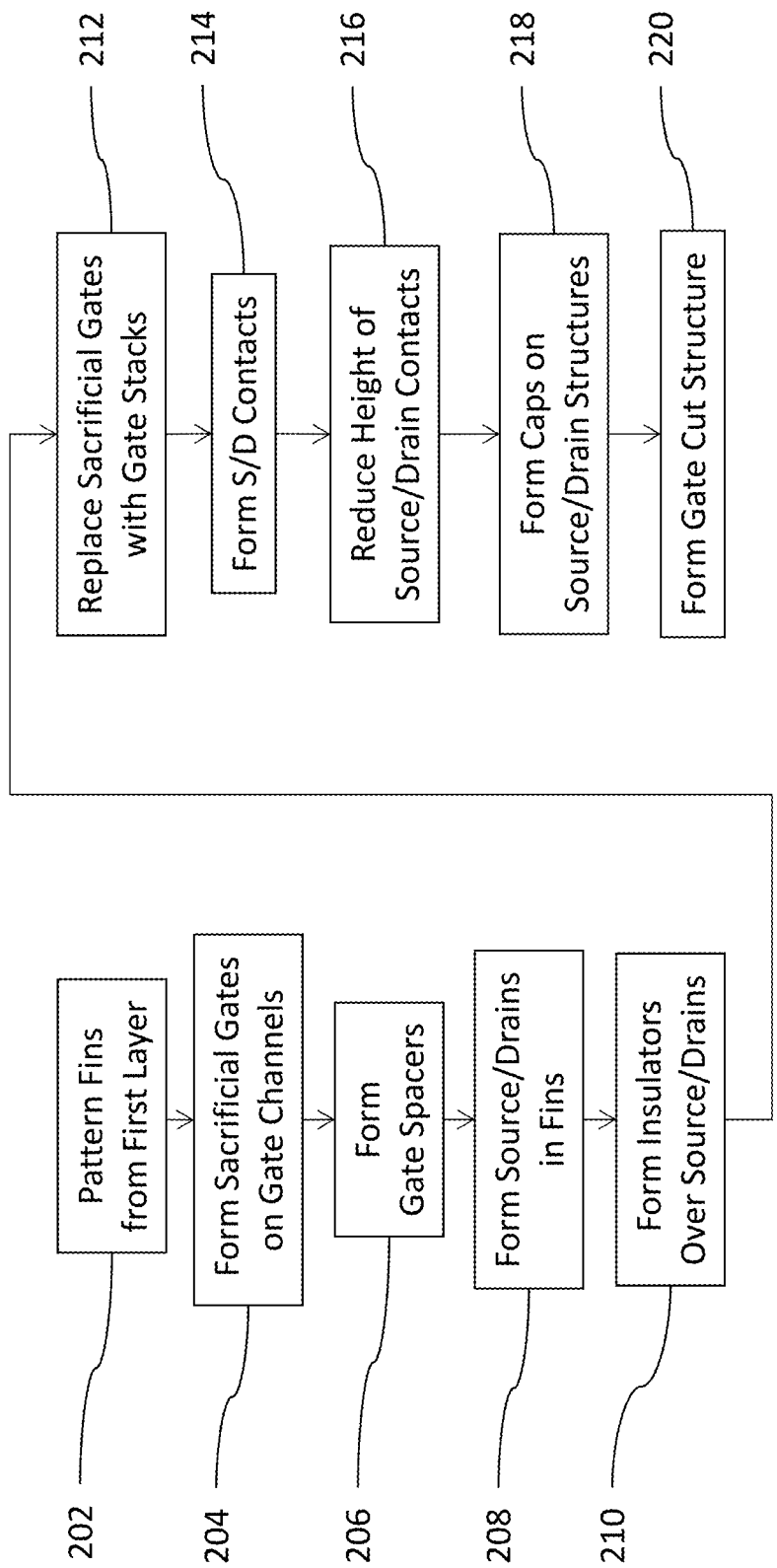
FIG. 12 is a flow diagram illustrating embodiments herein.

As shown in flowchart form in FIG. 12, exemplary methods herein pattern a first layer of material into fins in item 202, and such fins have a top surface that is sometimes referred to as a layer or substrate. This fin layer can be or have a semiconductor channel region. In item 204, such processing forms a sacrificial elongated structure extending over such a channel region of the layer. Also, in item 206 sidewall spacers are formed on the sacrificial elongated structure.

Subsequently, in item 208, these methods form source/drain structures in and/or on the layer on opposite sides of the sacrificial elongated structure. The source/drain structures are self-aligned by the spacers. Inter-gate insulators are formed over the source/drains in item 210. These methods replace the sacrificial elongated structure with a gate structure in item 212 (which can include a gate conductor over the channel region, and a stack insulator on the gate conductor). The processing in item 212 can include removal of the sacrificial elongated structure, formation of a gate insulator (gate oxide) on the channel region, and deposition of the gate conductor and gate stack insulator. As noted above, both the gate structure and the sacrificial elongated structure it replaces have inter-fin portions that extend beyond the channel region and are between the fins.

Further, in item 214, such methods form source/drain contacts on the source/drain structures on opposite sides of the gate structure. The sidewall spacers on the gate structure electrically insulate the gate structure from the source/drain contacts. Also, the sacrificial elongated structure, the gate structure, and the source/drain contacts are elongated structures that extend in a "first" orientation or direction, while the layer formed by the fin, and the source/drain structures formed in/on the layer are aligned across the channel region in a "second" orientation that is perpendicular to the first orientation. Further, the portion of the gate structure that extends beyond the channel region and is between the fins extends from the channel region in the first orientation.

In item 216, these methods reduce the height of the source/drain contacts (such that the gate structure extends further from the layer than do the source/drain contacts) thereby creating a recess. This allows these methods to form caps on the source/drain structures in such recesses in item 218.

After forming these caps in item 218, the methods herein form a gate cut structure (e.g., an insulator that extends completely through the gate structure) in item 220. The gate cut structure formed in item 220 interrupts the portion of the gate structure that extends beyond the channel region and is between the fins. The process of forming the gate cut structure in item 220 includes processes of removing the portion of the gate structure that extends beyond the channel region to create a cut recess, and forming a cut insulator in the cut recess. The caps protect the source/drain structure during the process of removing the portion of the gate structure that extends beyond the channel region. The cut insulator formed in item 220 electrically insulates one portion of the gate structure from another portion of the gate structure.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An apparatus comprising:
    parallel fins extending from a layer in a first orientation;
    parallel gate structures intersecting the fins in a second orientation perpendicular to the first orientation;
    parallel source/drain contacts in the second orientation between the gate structures, wherein the source/drain contact are discontinuous and are interrupted by an inter-gate insulator;
    caps on the source/drain contacts between the gate structures, wherein the source/drain contacts are between the caps and the layer; and
    a gate cut structure interrupting at least one of the gate structures,
    wherein the gate cut structure has a lower portion extending to the layer, and an upper portion, such that the lower portion is between the layer and the upper portion,
    wherein the upper portion of the gate cut structure includes extensions oriented in the first orientation,
    wherein the extensions have different thicknesses from each other; and
    wherein the extensions of the upper portion of the gate cut structure extend into at least one of the caps on the source/drain contacts.

2. The apparatus according to claim 1, wherein a first extension of the extensions of the upper portion of the gate cut structure extends into one of the caps on a first side of the gate cut structure, and
    wherein a second extension of the extensions of the upper portion of the gate cut structure extends into the inter-gate insulator on a second side of the gate cut structure, opposite the first side of the gate cut structure.

3. The apparatus according to claim 1, wherein the extensions of the gate cut structure extend a distance from the gate cut structure that is less than a distance between the gate structures.

4. The apparatus according to claim 1, wherein the caps comprise a different insulator material from the gate cut structure.

5. The apparatus according to claim 2, wherein the first extension and the second extension have top surfaces within a first plane,
    wherein the first extension has a first bottom surface opposite the top surfaces in a second plane different from the first plane,
    wherein the second extension has a second bottom surface opposite the top surfaces in a third plane different from the first plane and the second plane, and
    wherein the distance between the first bottom surface and the top surfaces is less than the distance between the second bottom surface and the top surfaces, such that the first extension that extends into one of the caps is thinner, in a direction perpendicular to the layer, than the second extension that extends into the inter-gate insulator.

6. The apparatus according to claim 2, further comprising a first sidewall spacer on the lower portion of the first side of the gate cut structure; and
    a second sidewall spacer on the lower portion of the second side of the gate cut structure,
    wherein the first sidewall spacer extends a first distance that is further from an underlying insulator relative to second distance the second sidewall spacer extends from the underlying insulator.

7. The apparatus according to claim 2, wherein the gate cut structure interrupts a first gate of the gate structures that is between a second gate of the gate structures and a third gate of the gate structures,
    wherein the one of the caps and one of the source/drain contacts is between the first gate and the second gate where the gate cut structure is located, and
    wherein the inter-gate insulator is between the first gate and the third gate where the gate cut structure is located.

8. A method comprising:
    forming source/drain structures on opposite sides of a channel region of a layer;
    forming spacers on a sacrificial elongated structure before the forming the source/drain structures, wherein the source/drain structures are self-aligned by the spacers;
    forming a gate structure over the channel region of the layer, wherein the gate structure includes a portion that extends beyond the channel region;
    forming source/drain contacts on the source/drain structures on opposite sides of the gate structure;
    forming caps on the source/drain structures; and
    after forming the caps, forming a gate cut structure interrupting the portion of the gate structure that extends beyond the channel region.

9. The method according to claim 8, wherein the forming the gate cut structure comprises:
    removing the portion of the gate structure that extends beyond the channel region to create a recess; and
    forming a cut insulator in the recess.

10. The method according to claim 8, wherein the gate structure extends in a first orientation, wherein the source/drain structures are aligned across the channel region in a second orientation perpendicular to the first orientation, and wherein the portion of the gate structure that extends beyond the channel region extends from the channel region in the first orientation.

11. The method according to claim 8, wherein the gate structure extends in a first orientation, and wherein the layer comprises a fin structure extending in a second orientation perpendicular to the first orientation.

12. The method according to claim 9, wherein the cut insulator electrically insulates one portion of the gate structure from another portion of the gate structure.

13. The method according to claim 9, wherein the caps protect the source/drain contacts during the removing the portion of the gate structure that extends beyond the channel region.

14. A method comprising:
    forming a sacrificial elongated structure extending over a channel region of a layer;
    forming source/drain structures on the layer on opposite sides of the sacrificial elongated structure;

replacing the sacrificial elongated structure with a gate structure, wherein the gate structure includes a portion that extends beyond the channel region;

forming source/drain contacts on the source/drain structures on opposite sides of the gate structure;

reducing a height of the source/drain contacts such that the gate structure extends further from the layer than the source/drain contacts;

forming caps on the source/drain structures; and after forming the caps, forming a gate cut structure interrupting the portion of the gate structure that extends beyond the channel region.

15. The method according to claim 14, wherein the forming the gate cut structure comprises:

removing the portion of the gate structure that extends beyond the channel region to create a recess; and forming a cut insulator in the recess.

16. The method according to claim 14, wherein the gate structure extends in a first orientation, wherein the source/drain structures are aligned across the channel region in a second orientation perpendicular to the first orientation, and wherein the portion of the gate structure that extends beyond the channel region extends from the channel region in the first orientation.

17. The method according to claim 14, further comprising forming spacers on the sacrificial elongated structure before the forming the source/drain structures, wherein the source/drain structures are self-aligned by the spacers.

18. The method according to claim 15, wherein the cut insulator electrically insulates one portion of the gate structure from another portion of the gate structure.

19. The method according to claim 15, wherein the caps protect the source/drain contacts during the removing the portion of the gate structure that extends beyond the channel region.

* * * * *